United States Patent
Zenz (10) Patent No.: US 11,222,861 B2
(45) Date of Patent: Jan. 11, 2022

(54) DUAL-INTERFACE IC CARD MODULE

(71) Applicant: NXP B.V., Eindhoven (NL)

(72) Inventor: Christian Zenz, Graz (AT)

(73) Assignee: NXP B.V., Eindhoven (NL)

( * ) Notice: Subject to any disclaimer, the term of this patent is extended or adjusted under 35 U.S.C. 154(b) by 268 days.

(21) Appl. No.: 16/523,442

(22) Filed: Jul. 26, 2019

(65) Prior Publication Data
US 2019/0355693 A1 Nov. 21, 2019

Related U.S. Application Data (62) Division of application No. 15/283,260, filed on Sep. 30, 2016, now Pat. No. 10,461,057.

(51) Int. Cl.
*H01L 23/00* (2006.01)
*G06K 19/077* (2006.01)
*H01Q 1/22* (2006.01)

(52) U.S. Cl.
CPC ........ *H01L 24/49* (2013.01); *G06K 19/07747* (2013.01); *G06K 19/07749* (2013.01); *G06K 19/07754* (2013.01); *G06K 19/07769* (2013.01); *H01L 24/08* (2013.01); *H01L 24/85* (2013.01); *H01Q 1/2208* (2013.01); *H01L 2224/04042* (2013.01); *H01L 2224/08111* (2013.01); *H01L 2224/08501* (2013.01); *H01L 2224/4912* (2013.01); *H01L 2224/85355* (2013.01)

(58) Field of Classification Search
CPC ....... G06K 19/07747; G06K 19/07749; G06K 19/07754; G06K 19/07769; H01L 24/49; H01L 24/08; H01L 24/85
See application file for complete search history.

(56) References Cited

U.S. PATENT DOCUMENTS

| 9,424,507 | B2 | 8/2016 | Zenz et al. |
| 9,536,188 | B2 | 1/2017 | Schoengrunder et al. |
| 2001/0028103 | A1* | 10/2001 | Usami ................. H01L 21/4846 257/679 |
| 2006/0091511 | A1 | 5/2006 | Kim et al. |
| 2009/0200650 | A1* | 8/2009 | Tan .................. G06K 19/07769 257/679 |
| 2012/0248201 | A1 | 10/2012 | Sutera |
| 2014/0374900 | A1 | 12/2014 | Kwon et al. |
| 2015/0294213 | A1* | 10/2015 | Ziemkus ............. H01L 23/3121 235/492 |
| 2017/0140257 | A1 | 5/2017 | Zenz |
| 2017/0270398 | A1 | 9/2017 | Mathieu et al. |

FOREIGN PATENT DOCUMENTS

| EP | 2 608 114 A1 | 6/2013 |
| FR | 2 765 010 | 12/1998 |

* cited by examiner

*Primary Examiner* — Kenneth Parker
*Assistant Examiner* — Long H Le (57) ABSTRACT

The disclosure relates to a dual-interface integrated circuit (IC) card module for use in a dual-interface IC card. Embodiments disclosed include a dual-interface integrated circuit card module (150), the module comprising: a substrate (104) having first and second opposing surfaces; a contact pad (102) on the first surface of the substrate; an integrated circuit (110) on the second surface of the substrate (104), the integrated circuit (110) having electrical connections to the contact pad (102) through the substrate (104); and a pair of antenna pads (108) disposed in recesses (103) in the second surface of the substrate (104) and electrically connected to corresponding antenna connections on the integrated circuit (110).

7 Claims, 11 Drawing Sheets

DUAL-INTERFACE IC CARD MODULE

CROSS-REFERENCE TO RELATED APPLICATIONS

This application is a Divisional of U.S. application Ser. No. 15/283,260 filed Sep. 30, 2016.

FIELD

The disclosure relates to a dual-interface integrated circuit (IC) card module for use in a dual-interface IC card.

BACKGROUND

An IC card, commonly known as a smart card, includes an embedded IC that can be used to store information and perform data processing. For example, such cards can be used in financial, transportation, security, healthcare and other applications to provide identification and authentication. Types of IC cards include contact IC cards that communicate via electrical contacts, contactless IC cards that communicate wirelessly through antennas, and dual-interface IC cards that can communicate via electrical contacts and wirelessly through an antenna, also embedded in the card.

A typical dual-interface IC card comprises a module containing the IC chip and electrical contacts. Such a module may be embedded into a card body. The card body may contain a secondary antenna inductively coupled to a primary antenna on the module, or may contain an antenna to be electrically connected to the IC chip.

Compared to contact IC cards and contactless IC cards, dual-interface IC cards allow users to switch between contact card readers and contactless card readers. However, since dual-interface IC cards include both electrical contacts and antennas, such cards are more expensive to manufacture.

SUMMARY

According to a first aspect of the present disclosure there is provided a dual-interface integrated circuit card module, the module comprising:
  a substrate having first and second opposing surfaces;
  a contact pad on the first surface of the substrate;
  an integrated circuit on the second surface of the substrate, the integrated circuit having electrical connections to the contact pad through the substrate; and
  a pair of antenna pads disposed in recesses in the second surface of the substrate and electrically connected to corresponding antenna connections on the integrated circuit.

Such a module may be more cost-effective than modules currently available in the market. In current dual-interface cards, a prefabricated double-sided contact base structure, such as double-sided tape, is typically used to provide a substrate with a contact pad on both sides of the substrate. The contact pads may be etched or stamped to provide front-side reader contacts and back-side antenna contacts. A module according to the first aspect may be manufactured from one-sided tape, as etched contacts for the antenna are not required on the back-side, thereby reducing the costs of manufacturing for a dual-interface card module.

In some embodiments, the recess may pass through the substrate, i.e. to the contact pad on the first face, and the antenna pad may be attached to the contact pad. In such cases, the contact pad may form the bottom surface of the recess to which the antenna pad is attached. Increasing the depth between the antenna pad and the second surface of the substrate allows longer bond wires to be used to connect the antenna pad to an IC chip on the second surface of the substrate. Longer bond wires may be less susceptible to break when the module is subjected to bending. In addition, bond wires connecting the antenna pads are covered by a thicker layer of encapsulation, thus increasing the mechanical reliability.

In some embodiments, the antenna pads may be electrically connected to the corresponding antenna connections on the integrated circuit by bond wires. The integrated circuit and bond wires may be encapsulated in a protective material.

In some embodiments, the antenna pads may each comprise a metal contact. Alternatively, the antenna pad may comprise a laminate with a metal contact layer.

In some embodiments, each antenna pad may comprise a first part that is entirely contained within a recess, and a second part extending out of the recess. Such embodiments may retain the advantage of a longer bond wires between the antenna lead and the IC card, but also provide with the second part an easier connection to an external antenna in a card module.

In some embodiments, the antenna pad may be bonded to a bottom surface of the recess, for example with a non-conductive adhesive. This may particularly be the case when the antenna pad comprises a metal contact, and where the recess extends through the substrate. In such cases, the non-conductive adhesive may provide an electrical insulation layer between the antenna pad and the contact pad.

In some embodiments, the antenna pad may be attached to a bottom surface of the recess such that the area of the antenna pad attached to the interior surface is less than the total area of the antenna pad. For example, a gap may be left between a part of each antenna pad and the bottom surface of the recess. This may limit the bending stress applied to the antenna pad when the substrate and contact pad are subjected to bending.

According to a second aspect of the present disclosure there is provided a dual-interface card comprising:
  a card body containing an antenna, the antenna having a pair of antenna connections; and
  a dual-interface integrated circuit card module according to the first aspect,
  wherein the antenna pads of the module are electrically connected to the electrical contact pads in the card body.

According to a third aspect of the present disclosure there is provided a method of manufacturing a dual-interface integrated circuit card module, the method comprising:
  providing a substrate having first and second opposing surfaces, with a contact pad on the first surface of the substrate;
  forming first and second recesses in the second surface of the substrate;
  placing an antenna pad into each of the first and second recesses;
  placing an integrated circuit on the second surface of the substrate;
  forming electrical connections between the integrated circuit and the contact pad through the substrate; and
  forming an electrical connection between each antenna pad and a corresponding antenna connection on the integrated circuit.

In some embodiments, forming an electrical connection between each antenna pad and a corresponding antenna connection on the integrated circuit may comprise electrically connecting bond wires between each antenna pad and a corresponding antenna connection. In such embodiments, the method may further comprise encapsulating the integrated circuit and bond wires in a protective material.

In some embodiments, placing an antenna pad into each of the first and second recesses may comprise bonding the antenna pad to a bottom surface of the recess. Bonding the antenna pad to a bottom surface of the recess may comprise applying an adhesive to a portion of the bottom surface, i.e. to only a part of the area between the antenna pad and the bottom surface According to a fourth aspect of the present disclosure there is provided a method of constructing a dual-interface integrated circuit card, the method comprising:
 providing a card body containing an antenna, the antenna having a pair of antenna connections;
 providing a dual-interface integrated circuit card module according to the first aspect;
 electrically connecting the antenna connections to the antenna pads of the module; and
 bonding the module to the card body.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

It should be noted that the figures are diagrammatic and not drawn to scale. Relative dimensions and proportions of parts of these figures have been shown exaggerated or reduced in size, for the sake of clarity and convenience in the drawings. Similar reference signs are generally used to refer to corresponding or similar feature in modified and different embodiments.

DETAILED DESCRIPTION OF EMBODIMENTS

Figure 1:
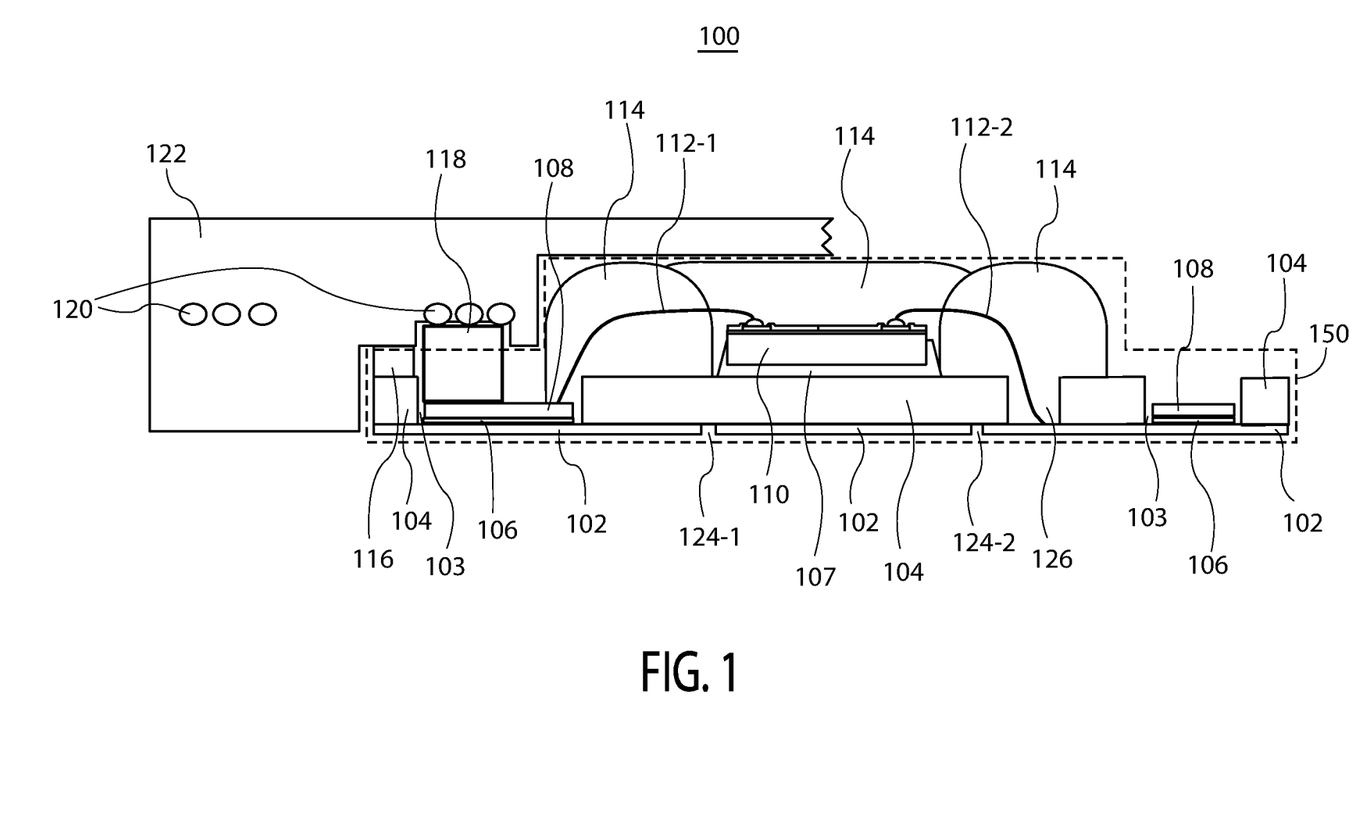
FIG. 1 illustrates a cross-sectional view of an example embodiment of a dual-interface IC card.

FIG. 1 is a cross-sectional view of an example embodiment of a dual-interface IC card 100. The dual-interface IC card can be used in financial, transportation, security, healthcare, or other applications to store information and perform data processing. In some embodiments, the dual-interface IC card has the ability to securely manage, store and provide access to data on the card, perform on-card functions, such as encryption, authentication, and authorization, and interact with a card reader. The dual-interface IC card can communicate by electrical contacts or wirelessly through an antenna. In an embodiment, the dual-interface IC card is a smart card, which can be used in near field communication (NFC) applications. In some embodiments, the IC card is a smart card that is designed to be compatible with the international standard ISO/IEC 14443 for identification cards. As described in more detail below, the manufacturing cost of the dual-interface IC card can be significantly lower than conventional dual-interface IC cards because the dual-interface IC card can be produced using a prefabricated single-sided contact base structure that is used to make a module for a contact smart card (e.g., a standard single-sided contact tape currently available in the marketplace), rather than a more expensive prefabricated double-sided contact base structure that is used to make a module for a dual-interface smart card (e.g., a standard double-sided contact tape currently available in the market).

In the embodiment depicted in FIG. 1, the dual-interface IC card 100 includes a contact pad 102, a substrate 104, an adhesive layer 106, antenna pads 108, an IC chip 110, bond wires 112-1, 112-2, an encapsulation 114, adhesive 116, electrical connection 118, an antenna 120, and a card body 122. The antenna pads 108 are disposed in recesses 103 in the substrate 104.

The contact pad 102, the substrate 104, the adhesive layer 106, the antenna pads 108, the IC chip 110, the bond wires 112, and the encapsulation 114 form a dual-interface IC chip module 150. Chip module 150 may be manufactured separately to the rest of card 100, and subsequently attached to the card body 122.

Although the dual-interface IC card is shown in FIG. 1 as including certain components, in other embodiments, the dual-interface IC card may include fewer components or additional components that are commonly found in conventional dual-interface smart cards.

The contact pad 102 of the dual-interface IC card 100 is used to make electrical contacts for the IC 110 to communicate with a card reader. The contact pad 102 is typically located at the front side of the dual-interface IC card while the card body 122 is located at the back side of the card. The contact pad 102 may be made of metal, for example a Gold (Au)-Nickel (Ni) plated Copper (Cu) foil or electroplated copper. The contact pad 102 provides electrical connectivity when the dual-interface IC card 100 is inserted into a card reader. In some embodiments, the contact pad is designed and produced to be compatible with the international standard ISO/IEC 7816 for electronic identification cards with contacts. The contact pad 102 typically includes groove/recess lines used to electrically insulate contact areas of the contact pad 102 from each other and make the contact pad more flexible. In the embodiment depicted in FIG. 1, the contact pad 102 has two groove lines 124-1, 124-2. However, in other embodiments, the contact pad may have any number of groove lines.

The substrate 104 is used to support other elements of the dual-interface IC card 100, such as the contact pad 102, the antenna pads 108 and the IC 110. The substrate 104 may be made of any suitable substrate material. As an example, the substrate 104 may be made of epoxy glass, fiberglass, or plastic substrates (polyethylene naphthalate (PEN), etc.). In the embodiment depicted in FIG. 1, bonding holes 126 are present on the substrate 104 to enable wire bonding of the IC 110 to the contact pad 102, which are located on opposite sides of the substrate 104. The substrate 104 may be in the form of a sheet or a tape. In some embodiments, the contact pad 102 and the substrate 104 form a single-sided contact base structure, which may be packaged into a single-sided contact tape. For example, a device manufacturer may produce a prefabricated single-sided contact base structure that includes the contact pad 102 and the substrate 104 in mass quantities. In some embodiments, an optional adhesive layer (not shown) may be located between the contact pad 102 and the substrate 104.

An adhesive layer 106 is used to attach the antenna pads 108 onto the module 150. In the illustrated example, antenna pads 108 are disposed in recesses 103 in the substrate 104 which pass completely through the substrate, exposing a part of the underside of the contact pad 102. The adhesive layer 106 attaches each antenna contact 108 to the contact pad 102 within the recess 103. In alternative embodiments, recesses 103 may not pass completely through the substrate 104. For example, recesses 103 may comprise a recess in the second surface of substrate 104, i.e. the surface opposite to the one to which the contact pad 102 is attached. Adhesive 106 may attach the antenna pad 108 to the substrate 104 at the bottom of such a recess.

The adhesive layer 106 may be made of any suitable adhesive material. In some embodiments, the adhesive layer 106 is made of a glue. The adhesive layer 106 can be formed by applying an adhesive material (e.g., glue) on the substrate and/or the antenna pads by various processes. For example, the adhesive material may be dispensed on the substrate 104 or pre-applied on the antenna pads 108. A curing process (e.g., oven curing) may then be performed to cure the adhesive material. The adhesive layer 106 may in particular comprise a non-conducting adhesive, to provide an insulating layer between the antenna pad 108 and contact pad 102. Alternatively, other methods of attaching the antenna pads 108 into recesses 103 may be used, for example mechanical means.

The antenna pads 108 of the dual-interface IC card 100 are used to provide electrical contacts between an antenna (e.g., the antenna layer 120) and the IC 110. The antenna pads 108 may be made of any suitable conductive material. For example, the antenna pads 108 may be made of a metal foil or a metal laminate, which includes a metal layer on a substrate. In some embodiments, the antenna pads 108 may be made of gold and nickel (Au—Ni) plated copper (Cu) or silver (Ag) plated Copper. The antenna pads 108 may be made in any suitable dimensions. In some embodiments, the antenna pads 108 have a uniform thickness. For example, the thickness of the antenna pads 108 may be in the range of between 10 micrometres ($\mu m$) and 150 $\mu m$, which overlaps with the standard thickness for antenna pads (e.g., between 18 $\mu m$ and 35 $\mu m$ for Cu foil) of smart cards. The antenna pads 108 may be produced by any suitable process, including (without being limited to), punching, etching and laser cutting a sheet of conductive material. In some embodiments, the antenna pads 108 are produced by punching either a standalone conductive sheet or a conductive sheet in a reel-to-reel format. In some embodiments, the antenna pads 108 are produced by depositing a metal layer on a plastic substrate material. In some embodiments, the antenna pads 108 are plated with suitable material, such as Ni, Au and/or Ag, for better antenna attachment or for better wire bond attachment. The antenna pads 108 may be made of any suitable shape or dimension. In some embodiments, the antenna pads 108 are designed and produced with features to ease the interconnection process with the substrate 104 or underside of contact pad 102. For example, one or more antenna pads 108 may have a spring like feature or may be crimped to improve adhesion of the conductive material (e.g., glue etc.) used in the interconnection process. The antenna pads 108 can be placed into recesses 103 and attached to the substrate 104 or contact pad 102 by a pick-and-place process in which one or more antenna pads 108 are picked up and placed in the recesses 103. Alternatively, the antenna pads 108 can be attached to the substrate 104 in a reel-to-reel process in which adhesive is applied to the antenna pads 108 on a first reel, which is then applied onto a second reel, i.e., the single-sided contact tape, similar to the process of attaching a sheet of paper labels onto products. Although the antenna pads 108 are shown in FIG. 1 as being electrically connected to the antenna layer 120 through an electrical connection 118, in other embodiments the antenna pads 108 may be in direct contact with the antenna 120. In addition, in other embodiments, the antenna pads 108 may be either connected to an antenna located on the substrate 104 or connected to a small antenna directly placed on the substrate, to be compliant with ISO/IEC 14443 requirements. In these embodiments, the antenna acts as a primary antenna, which is electromagnetically coupled to the secondary antenna 120 located on the card substrate.

In some embodiments the contact pad 102, the substrate 104, the adhesive layer 106, and the antenna pads 108 form a dual-interface module, which may be produced in mass quantities. For example, a device manufacturer can produce dual-interface module in mass quantities based on prefabricated single-sided contact base structures, such as prefabricated single-sided contact tapes provided by Linxens, Interplex, Kinsus, LG Innotek and Possehl.

The IC 110 of the dual-interface IC card 100 includes circuitry to securely manage, store and provide access to data on the card and/or perform on-card functions, such as encryption, authentication, and authorization. The IC 110 is designed to communicate with another device (e.g., a card reader) by electrical contacts or wirelessly through an antenna. In the embodiment depicted in FIG. 1, the dual-interface IC card 100 includes a single IC 110 with both contact and contactless interfaces, which makes is possible to access the IC 110 using either a contact interface (e.g., the contact pad 102) or a contactless interface (e.g., the antenna 120) with a high level of security. Alternatively, the dual-interface IC card 100 may include two ICs, including one IC with a contact interface and another, separate, IC with a contactless interface. The IC 110 may be attached to the substrate 104 using any appropriate method. As an example, in some embodiments, the IC 110 is glued onto the substrate 104 using an adhesive layer 107.

The bond wires 112-1, 112-2 of the dual-interface IC card 100 are used to electrically connect the IC 110 to the contact pad 102 and to the antenna 120. The bond wires 112-1, 112-2 may be made of any suitable metal (e.g., Gold, aluminium or copper). In the embodiment depicted in FIG. 1, the bond wire 112-1 electrically connects the IC 110 to one antenna pad 108, which is electrically connected to the antenna 120, while the bond wire 112-2 electrically connects the IC 110 to the other contact pad 108 (the connection to the antenna 120 not being shown in this view). Bond pads may be used to attach the bond wires 112-1, 112-2 to the IC 110, the antenna pads 108, and/or the contact pad 102.

Encapsulation 114 is used to protect the bond wires 112-1, 112-2 and the IC 110. The encapsulation 114 may be made of a suitable material, such as epoxy, in a process such as glob-top or moulding.

Figure 2:
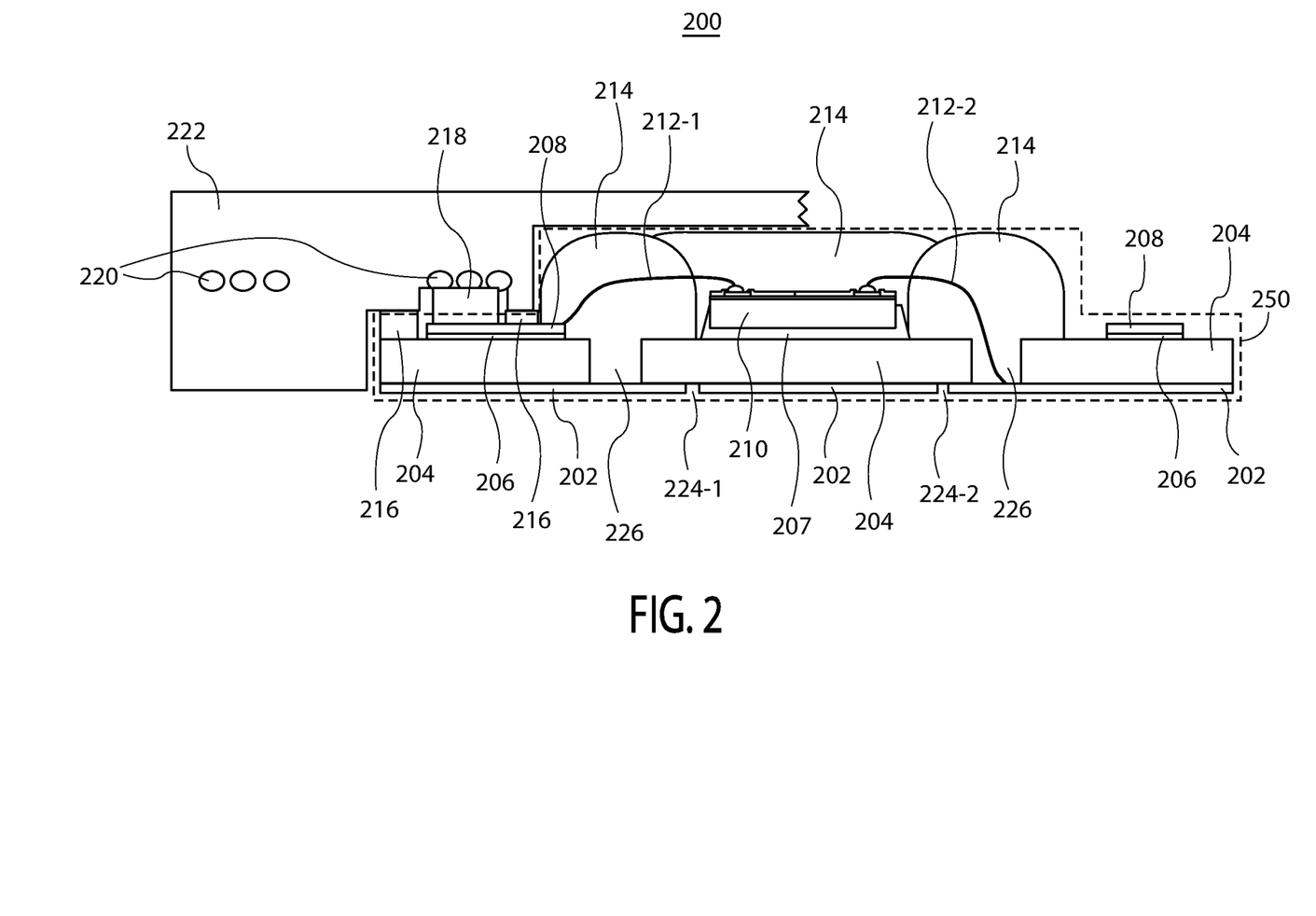
FIG. 2 illustrates a cross-sectional view of an example dual-interface IC card.

FIG. 2 shows an example of an alternative possible arrangement of a dual-interface card 200 including a dual-interface module 250 based on single-sided tape, to highlight the advantage of a module according to the present disclosure. The example card 200 of FIG. 2 is substantially similar to the card 100 of FIG. 1. The common features of card 200 are shown with similar reference numerals to those used in FIG. 1.

In example module 250, the antenna pads 208 are not disposed in recesses or recesses in the substrate 204. Instead, antenna pads 208 are placed on the surface of the substrate 204. Bond wires 212-1 of module 250 are therefore shorter than bond wires 112-1 of module 150, as there is less distance between the antenna pads 208 and IC chip 210 of module 250.

Shorter bond wires are more likely to shear off or break when the card 200 is exposed to mechanical stress, for example when the card 200 is bent. This can result in an electrical failure. The increased depth available between the antenna pads 108 and IC 110 in module 150 due to the antenna pads 108 being disposed in recesses 103 permits longer bond wires to be used, which are less susceptible to breaking when the module is exposed to mechanical stress. In addition, the increased depth between the antenna pad 108 and the IC 110 allows for more protection of the critical connection between the bond wire 112-1 and the antenna pad 108 (sometimes referred to as wedge or stitch bond) by a thicker layer of encapsulation. Embedding the antenna pad 108 into a recess will also decrease the stiffness of the module compared to a module as depicted in FIG. 2. Dual-interface modules according to the present disclosure, for example the embodiment illustrated in FIG. 1, may therefore be more resilient when under mechanical stress than the example module of FIG. 2.

Figure 3:
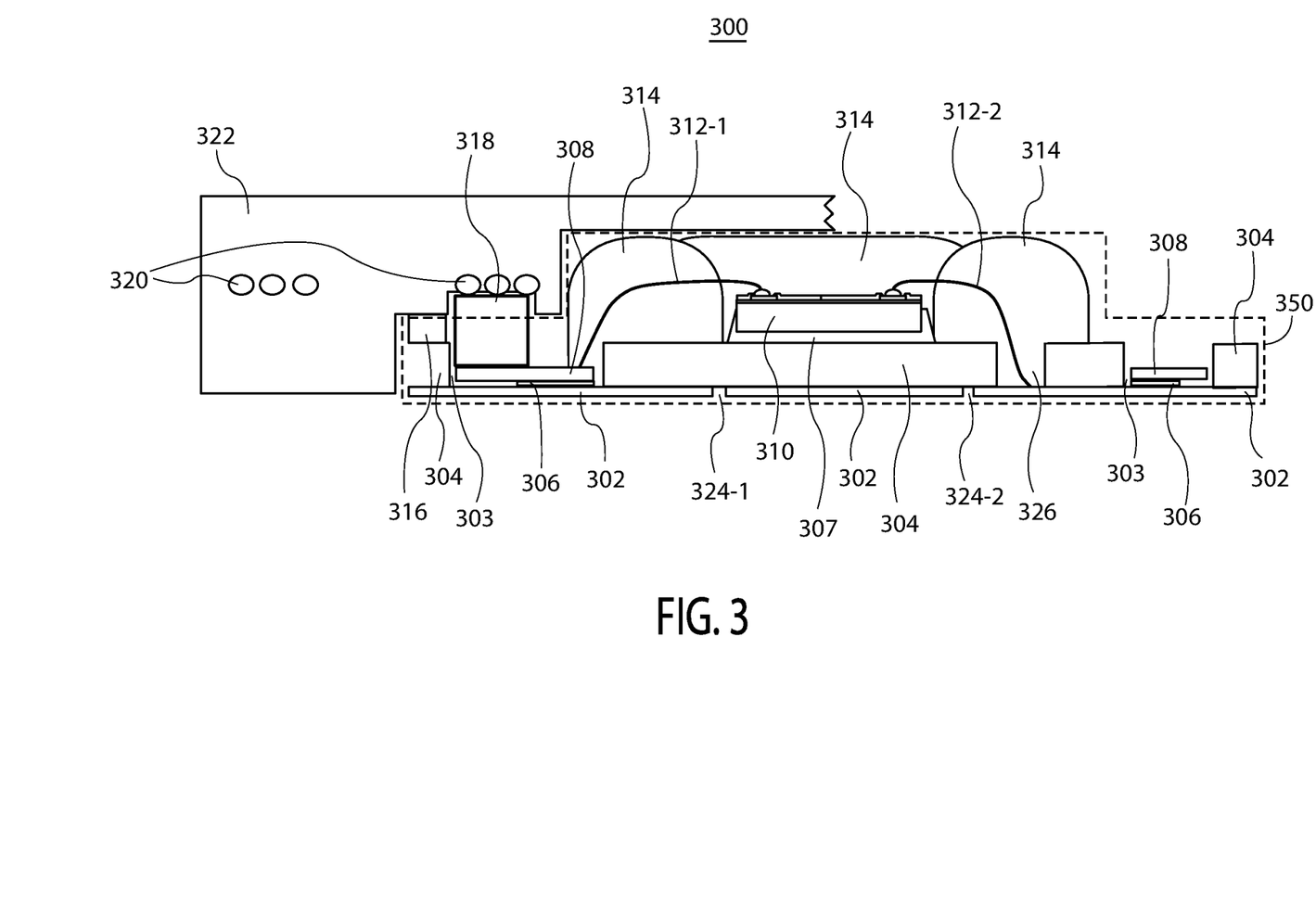
FIG. 3 illustrates a cross-sectional view of a dual-interface IC card in accordance with an alternative example embodiment.

FIG. 3 shows an alternative embodiment of a dual-interface module 350 that may be used to increase the flexibility of the module. Dual-interface module 350 comprises all of the features of module 150, which are labelled in FIG. 3 with similar reference numerals to the corresponding features in FIG. 1. However, in module 350, the adhesive layer 306 covers only a portion of the overlapping area between antenna pad 308 and contact pad 302. Therefore only a part of the antenna pad 308 is attached to the contact pad 302. If contact pad 302 bends, mechanical stress is only applied to that part of the antenna pad 308 attached to the contact pad 302. Module 350 may therefore have increased flexibility, and be less likely to suffer an electrical failure due to bending, compared with module 100.

Figure 4:
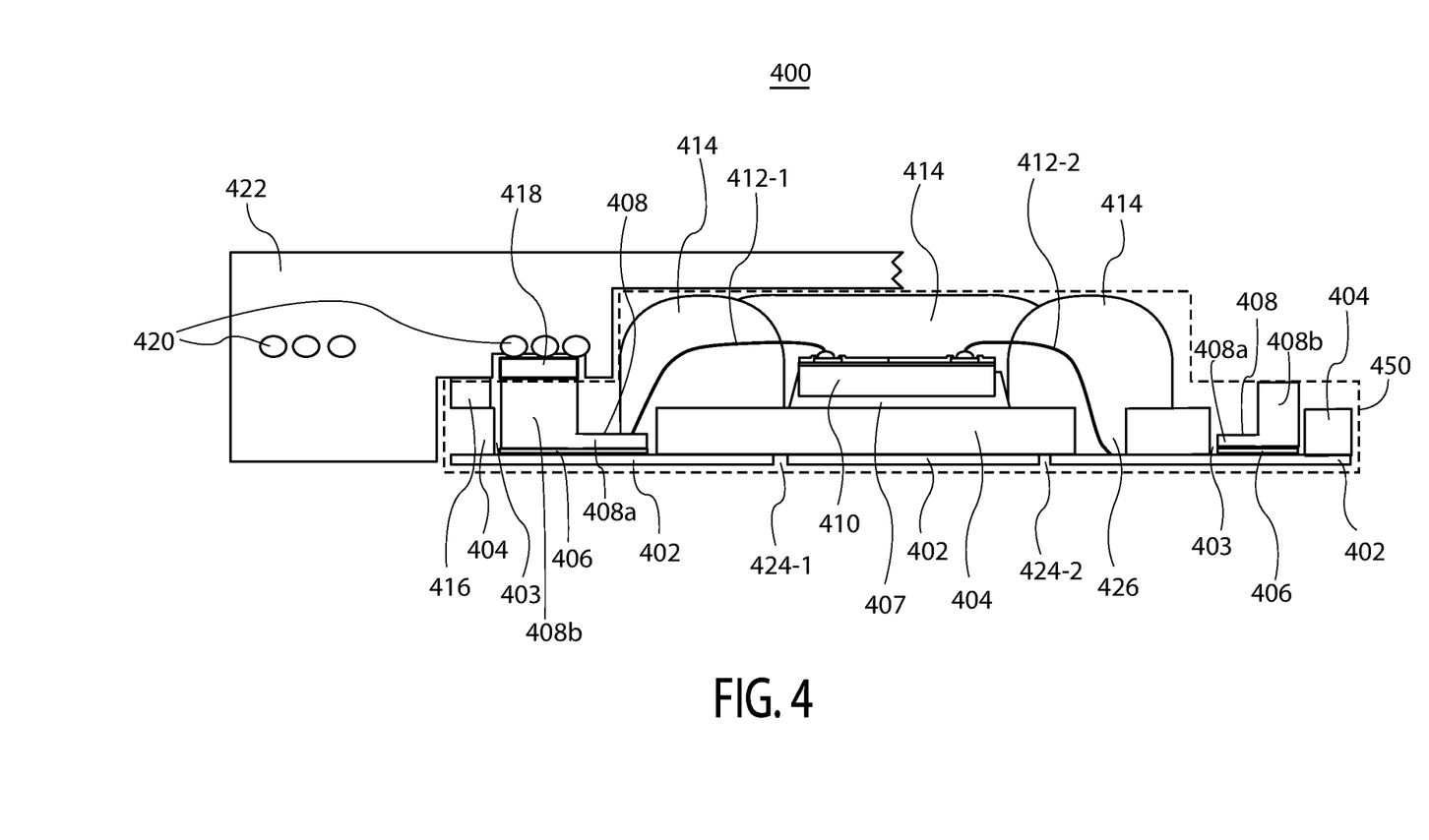
FIG. 4 illustrates a cross-sectional view of a dual-interface IC card in accordance with a further alternative example embodiment.

FIG. 4 illustrates an alternative embodiment of a dual-interface card 400 comprising a dual-interface module 450. Dual-interface module 450 comprises all of the features of module 150, which are labelled in FIG. 4 with similar reference numerals to the corresponding features in FIG. 1. Module 450 comprises an antenna pad 408 with a first part 408a and a second part 408b, which are in electrical contact with each other. The first part 408a is thinner than the second part 408b of the antenna pad 408. In the illustrated embodiment, the first part 408a is entirely contained within the recess 403, whereas the second part 408b extends out of the recess 403, above the second surface of the substrate 404. The first part 408a may be used to connect the antenna pad 408 to the IC chip 410 using a bond wire 412-1 as in modules 150 and 350. The thin first part 408a maintains the advantage of using long bond wires 412-1 to decrease the likelihood of electrical failure due to mechanical stress. The second part of the antenna pad 408b allows an electrical connection to be more easily made between the antenna pad 408 and a module connector of a card body, for example module connector 418 of card body 422 in the illustrated example. This may be particularly advantageous if the card body 422 is produced separately to the module. For example, the card body 422 may be a standard component to which a module is attached. The module 450 may maintain the advantages of the present disclosure without requiring any modifications to be made to the card body 422.

Figure 5:
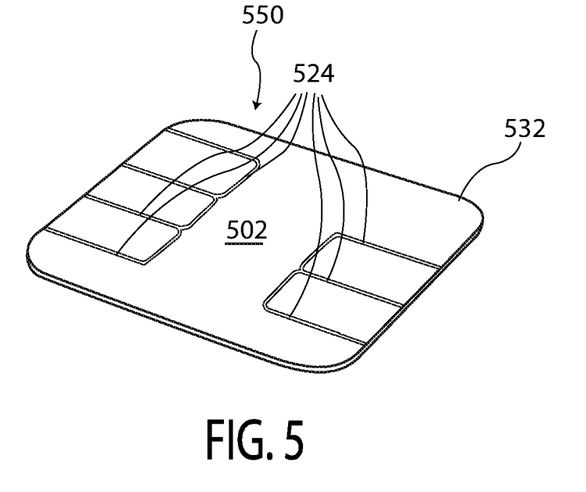
FIG. 5 illustrates a contact pad side view of a dual-interface IC chip module of the type depicted in FIG. 1.

FIG. 5 depicts a front-side view of an embodiment of the dual-interface IC module 150 depicted in FIG. 1. The features of the front-side illustrated in FIG. 5 may equally apply to the embodiments of modules 350 and 450 shown in FIGS. 3 and 4 respectively. In the embodiment depicted in FIG. 5, a front-side view of a dual-interface IC module 550 shows a contact pad 502, which includes a contact plate 532 and groove lines 524. The contact pad 502 depicted in FIG. 5 is one possible embodiment of the contact pad 102, 302, or 402 depicted in FIGS. 1, 3, and 4 respectively. However, the contact pads 102, 302, and 403 are not limited to the embodiment shown in FIG. 5. For example, the contact pads 102, 302, or 402 may have groove/recess lines that are different from the groove lines 524 shown in FIG. 5.

Figure 6:
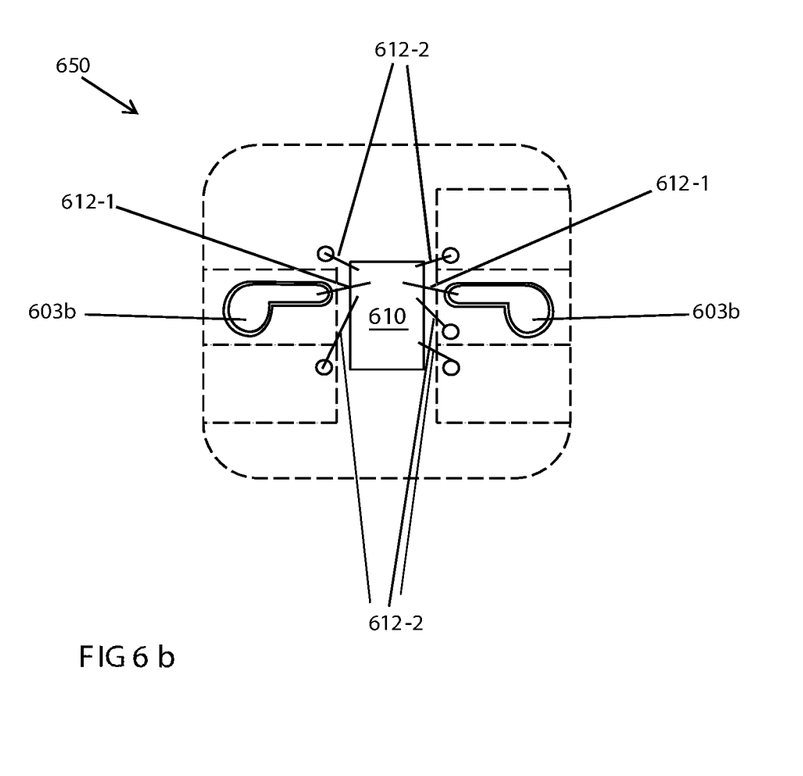
FIG. 6a illustrates a back-side plan view of the dual-interface IC chip module depicted in cross section in FIG. 2, with antenna pads on a leadframe.
FIG. 6b illustrates a back-side view of an embodiment of a dual-interface IC chip module.
Figure 6A:
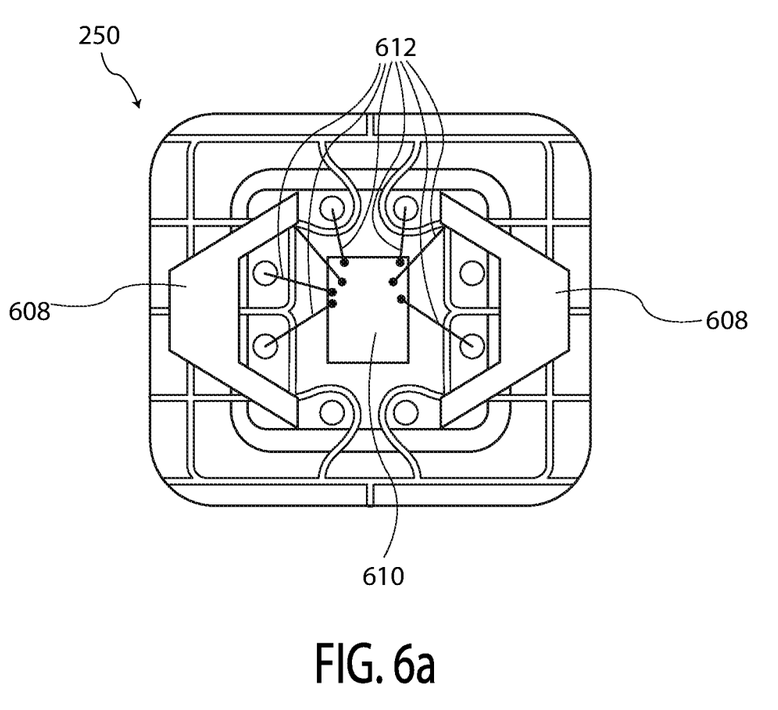

FIG. 6a depicts a back-side view of the dual-interface IC module 220 depicted in FIG. 2. FIG. 6a shows a back-side view of the dual-interface IC module with an IC 610, bond wires 612, and antenna pads 608 which are disposed on the backside of the leadframe.

FIG. 6b depicts an exemplary embodiment with a example recess shape 603 in a back-side view of a dual-interface module 650. The recesses 603 depicted in FIG. 6b are possible embodiments of the recesses 103, 303, or 403. However, the recesses 103, 303, or 403 are not limited to the embodiment shown in FIG. 6b. The features of this embodiment may be used with any of modules 150, 350, 450, and 550. Module 650 comprises an IC 610 and recesses 603a, 603b. Bond wires 612-2 connect the IC chip 610 to the contact pad on the other surface of the substrate. Bond wires 612-1 are shown to represent how the IC 610 may be electrically connected to antenna pads disposed in recesses 603a, 603b.

A process of manufacturing a dual-interface IC chip module according to the present disclosure, such as modules 150, 350, 450, is described with reference to FIGS. 7-15. Compared with a conventional manufacturing process in which a dual-interface IC chip module is made using a relatively expensive double-sided contact tape as a base structure, the manufacturing process produces a dual-interface IC chip module using a cost-effective prefabricated single-sided contact base structure, e.g., a single-sided contact tape, and antenna pads that are attached to the single-sided contact base structure. By using the prefabricated single-sided contact base structure, the cost of the dual-interface IC chip module is significantly reduced.

Figure 7:
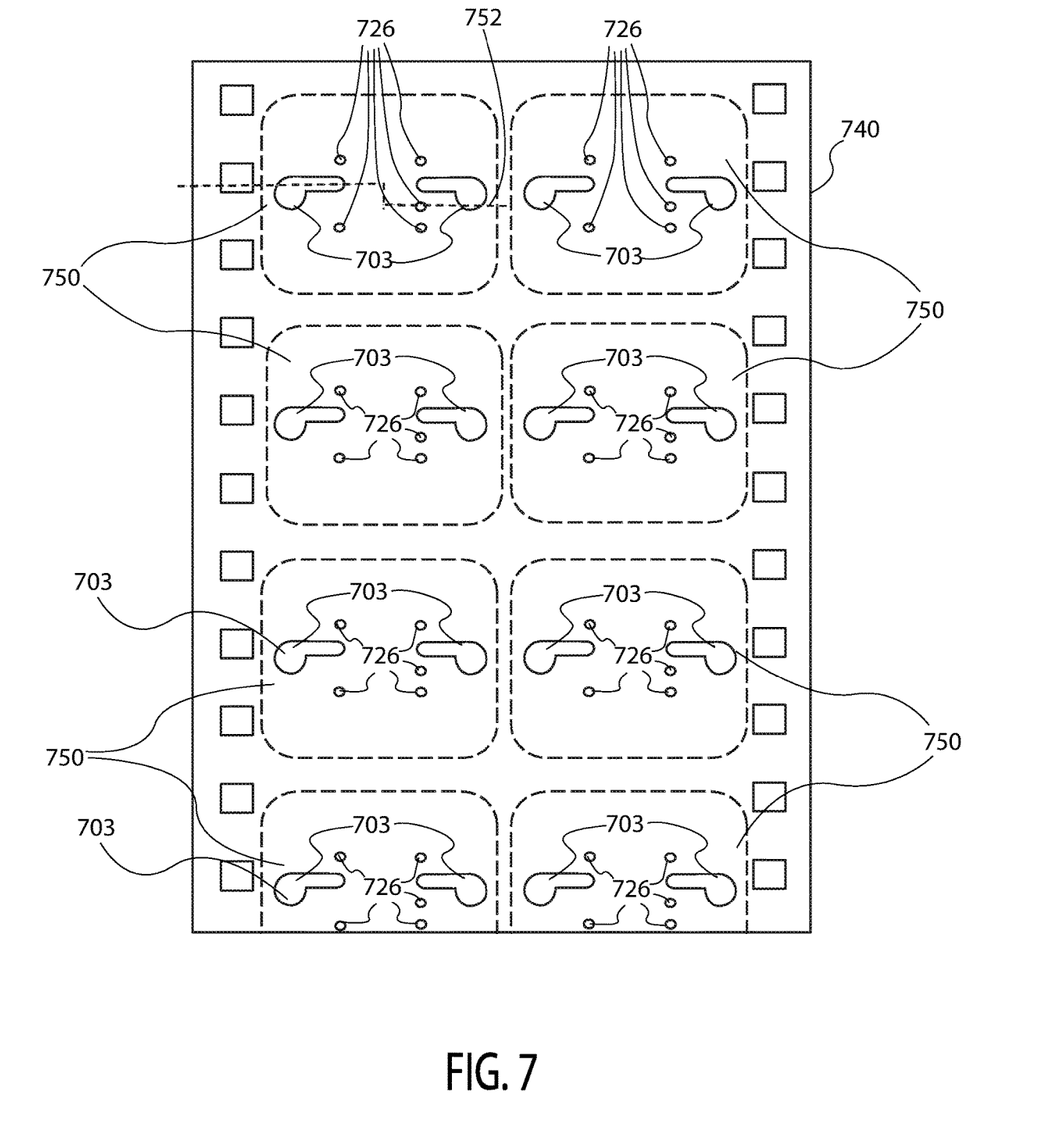
FIG. 7 illustrates an example embodiment of a single-sided contact tape for producing a dual-interface contact base structure for the dual-interface IC chip module depicted in FIG. 1

As illustrated in FIG. 7 the process of manufacturing a dual-interface IC chip module begins by obtaining a single-sided contact tape 740 having multiple single-sided contact base structures 750. In FIG. 7, the single-sided contact tape 740 includes two columns of single-sided contact base structures 750. As shown in FIG. 7, a back-side view of the single-sided contact tape shows the back-side of single-sided contact base structures with bonding holes 726 and the recess 703 for the antenna pads. The single-sided contact tape may be in the form of standalone sheet or in a reel-to-reel format. Although the single-sided contact tape is shown in FIG. 7 as including two columns of single-sided contact base structures, in other embodiment, the single-sided contact tape may include a single column or more than two column of single-sided contact base structures. In addition, although the single-sided contact base structure 750 is shown in FIG. 7 as including certain number of bonding holes, in other embodiment, the single-sided contact base structure may include bond recesses in any suitable number. The single-sided contact tape may be obtained from a tape supplier, such as Linxens, Interplex, Kinsus, LG Innotek and Possehl.

Figure 8:
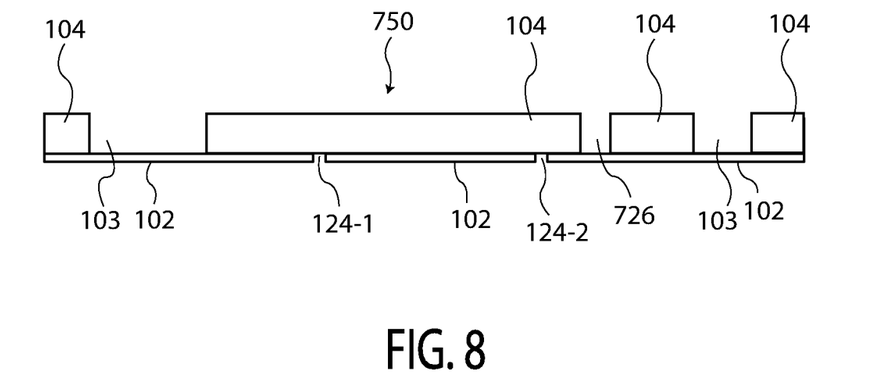
FIG. 8 illustrates a cross-sectional view of the single-sided contact tape depicted in FIG. 7.

FIG. 8 is a cross-sectional view (along a dotted line 752 shown in FIG. 7) of the single-sided contact base structure 750 depicted in FIG. 7. In the embodiment of FIG. 8, the single-sided contact base structure 750 includes the contact pad 102 with groove lines 124-1, 124-2, and the substrate 104. Bonding holes 426 are present on the substrate to enable wire bonding to the contact pad 102. Recesses 103 are formed in the substrate 104. For example, the recesses 103 may be formed in the same process as the bonding holes 426 using mechanical processes, such as punching, milling, drilling, or cutting. The substrate 104 may be fully covered with adhesive before punching the bonding holes and recesses and laminating with a contact foil, which is later structured by a wet etching process to form the contact pad.

The manufacturing process then proceeds to the next step in which antenna pads are attached to the single-sided contact tape using the applied adhesive to form a dual-interface contact tape with multiple dual-interface contact structures. The antenna pads can be attached to the single-sided contact tape by a pick-and-place process in which one or more antenna pads are picked up and placed in the recesses on the single-sided contact tape. Alternatively, the antenna pads can be attached to the single-sided contact tape in a reel-to-reel process in which adhesive is applied to the antenna pads on a first reel, which is then applied onto a second reel, i.e., the single-sided contact tape, similar to the process of attaching a sheet of paper labels onto products.

Figure 9:
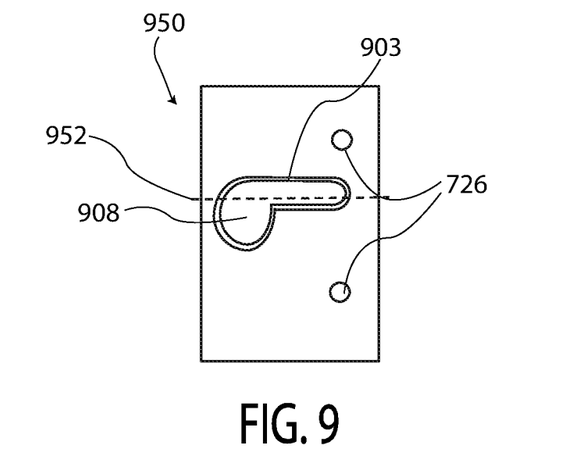
FIG. 9 illustrates an example embodiment of a dual-interface contact structure having an antenna pad.

FIG. 9 depicts a portion 950 of the dual-interface contact tape with an attached antenna pad 908 disposed in a recess 903, which is part of a single dual-interface contact structure. In FIG. 9, the antenna pad 908 is attached to the single-sided contact tape 740 via the applied adhesive. Alternatively, the antenna pad can be attached to the single-sided contact tape by applying an adhesive to the antenna pad and then placing antenna pad with the adhesive into the recess on the single-sided contact tape. The antenna pad 908 and recess 903 depicted in FIG. 9 is one possible embodiment of the antenna pads 108, 308, or 408 depicted in FIGS. 1, 3, and 4 respectively. However, the antenna pads 108, 308, or 408 are not limited to the embodiment shown in FIG. 9.

Figure 10:
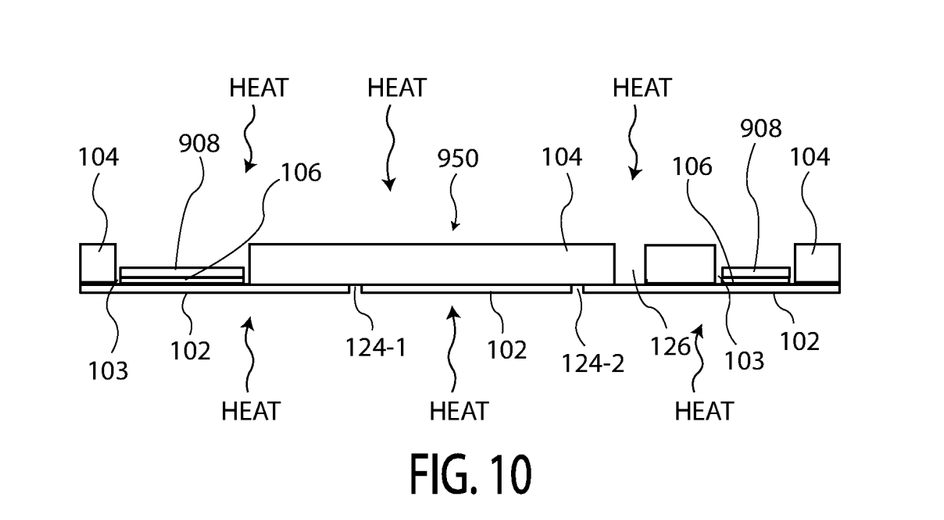
FIG. 10 illustrates a cross-sectional view of the dual-interface contact structure depicted in FIG. 9.

FIG. 10 is a cross-sectional view (along a dotted line 952 shown in FIG. 9) of the dual-interface contact tape, which includes the dual-interface contact structure portion 950 depicted in FIG. 9. In particular, FIG. 10 shows a single dual-interface contact structure formed within the dual-interface contact tape. As shown in FIG. 10, the dual-interface contact structure includes the contact pad 102 with groove lines 124-1, 124-2, the substrate 104 with recesses 103, the adhesive layer 106 in recesses 103, and two antenna pads 908 in recesses 103. A curing step (e.g., oven curing) may be performed by applying heat to the dual-interface contact structure. Since the dual-interface contact structure of FIG. 10 is made from an inexpensive single-sided contact tape, the cost of the dual-interface contact structure is significantly lower than a comparable conventional dual-interface contact structure made from a more expensive double-sided contact tape.

Figure 11:
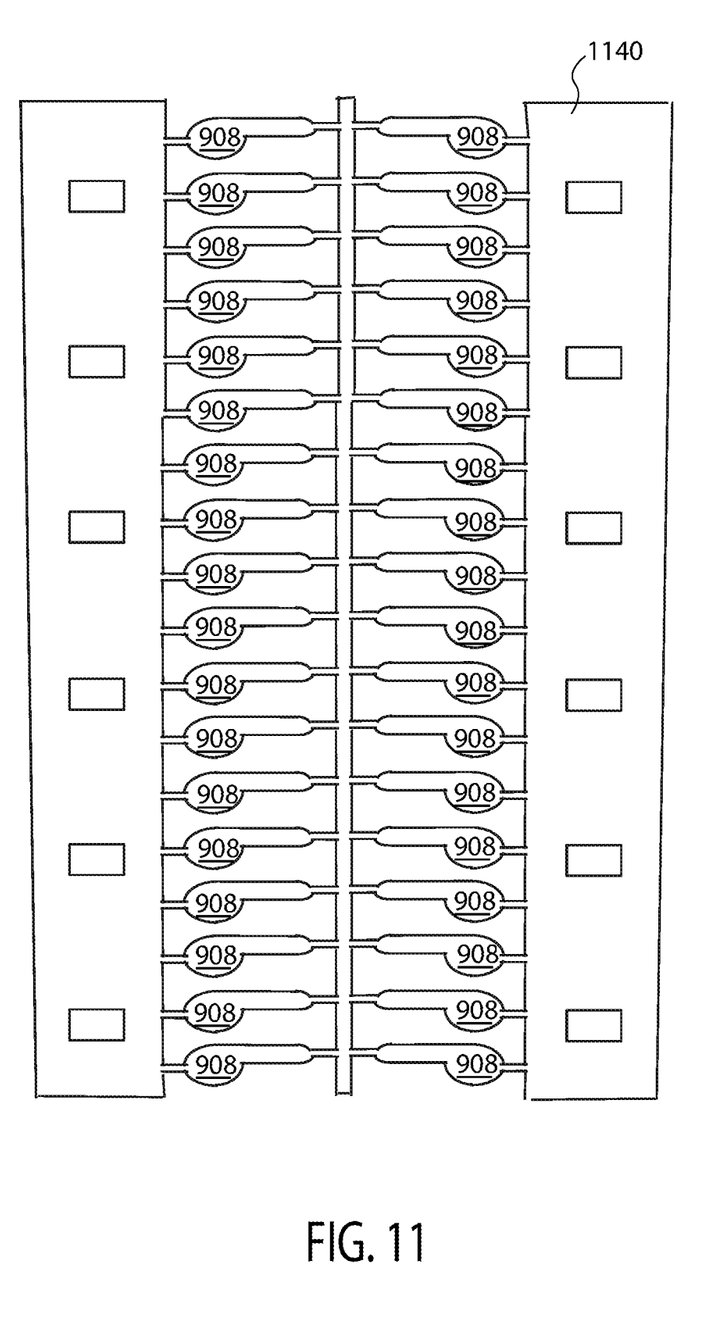
FIG. 11 depicts an example embodiment of a sheet of metal material with defined columns of antenna pads.

In an embodiment, the antenna pads 908 shown in FIGS. 9 and 10 are produced from a sheet of conductive material. As an example, FIG. 11 depicts a sheet of conductive material 1160 that includes two rows of antenna pads 908. In the embodiment depicted in FIG. 11, the antenna pads 908 are punched out of the sheet of conductive material. However, in other embodiments, the antenna pads may be etched or laser cut out of the sheet of conductive material or additively deposited on a substrate by galvano plating or conductive printing.

Figure 12:
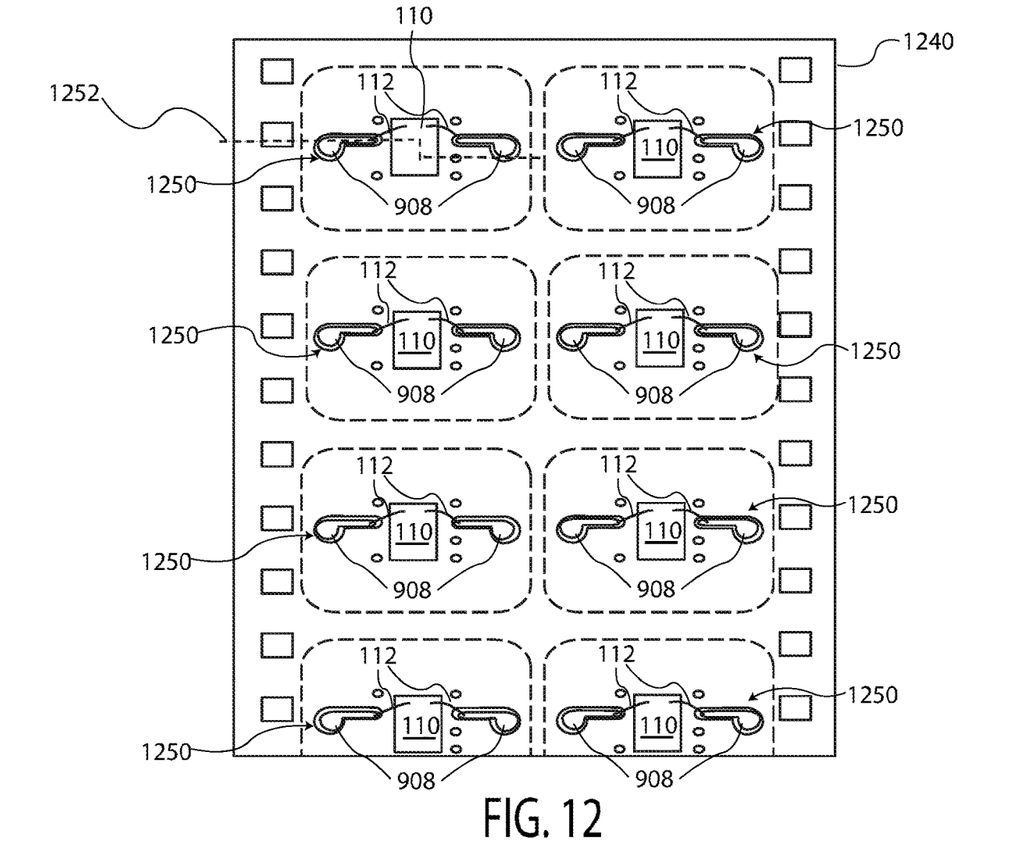
FIG. 12 illustrates an example embodiment of a reel of dual-interface IC chip modules produced using the dual-interface contact structure depicted in 9 and 10.

After the antenna pads 908 have been attached to the single-sided contact tape 740 to form the dual-interface contact tape, the manufacturing process proceeds to the next step in which IC chips, bond wires and encapsulations are added to the dual-interface contact structures in the dual-interface contact tape to form dual-interface IC chip modules in the dual-interface contact tape. FIG. 12 depicts an embodiment of a dual-interface contact tape 1240 having multiple dual-interface IC chip modules 1250, which are formed by attaching the IC chips 110 to dual-interface contact structures, attaching the bond wires 112 to the antenna pads 908 and to the contact pad 102 (not shown in FIG. 12), and then forming the encapsulations 114 over the IC chips and the bond wires.

A separation (e.g., punching or cutting) step can then be performed to separate (e.g., punch out or cut) the dual-interface contact tape 1240 to separate the dual-interface IC chip modules 1250 into individual pieces. For example, a punching process can be performed based on the outline shown in FIG. 7 to separate the dual-interface IC chip modules into individual pieces after a hotmelt tape is applied to the backside of the tape 740. The dual-interface IC chip module 1250 depicted in FIG. 11 is one possible embodiment of the dual-interface IC chip module 150, 350, or 450. However, the dual-interface IC chip modules 150, 350, 450 are not limited to the embodiment shown in FIG. 12.

Figure 13:
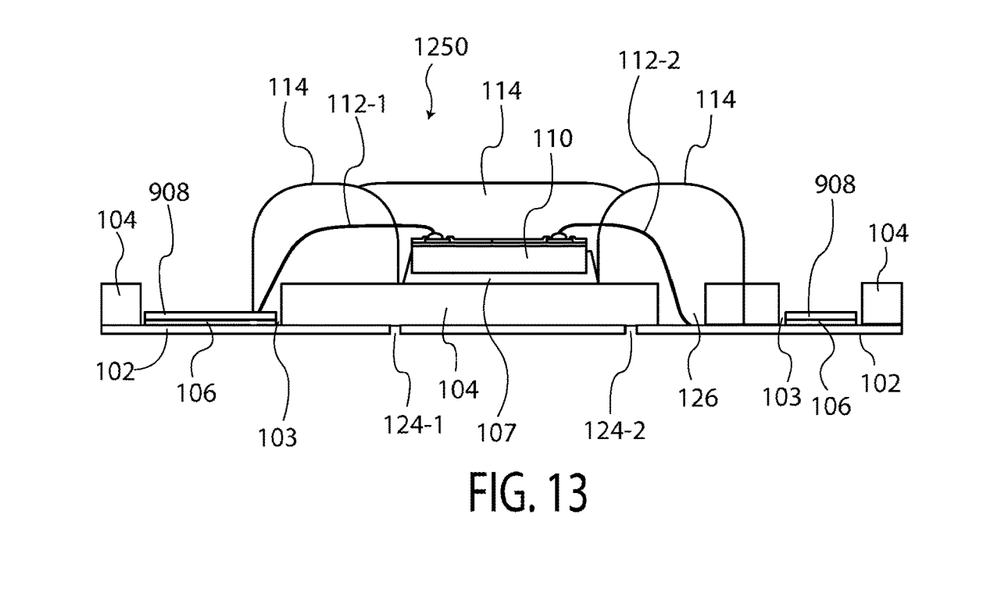
FIG. 13 is a cross-sectional view of an example embodiment of a dual-interface IC chip module.

FIG. 13 is a cross-sectional view (along a dotted line 1252 shown in FIG. 12) of one of the dual-interface IC chip modules 1250 depicted in FIG. 12. As shown in FIG. 13, the dual-interface IC chip module includes the contact pad 102 with the groove lines 124-1, 124-2, the substrate 104, the adhesive layer 106, the two antenna pads 908, the IC chip 110, the bond wires 112, and the encapsulation 114.

Turning back to FIG. 1, adhesive 116 is used to attach the dual-interface IC chip module 150, which may be formed in the same manner as the dual-interface IC chip module 1250, to the card body 122. The adhesive may be made of a suitable material, such as film material or gel material (e.g., epoxy, acrylate). In an embodiment, the adhesive 116 is a hot melt adhesive material, such as adhesive epoxy or any other thermoplastic material, which becomes viscous with heat.

The module connector 118 of the dual-interface IC card 100 is used to provide electrical connectivity between the antenna pads 108 and the antenna 120. The electrical connection may be made of any suitable conductive material. For example, the electrical connection 118 may be made of a conductive adhesive, a solder or a conductive polymeric material.

The antenna 120 of the dual-interface IC card 100 is used to communicate wirelessly with another device (e.g. a card reader). The antenna 120 may be made of metal or other suitable material. In some embodiments, the antenna 120 is made of a metal coil, such as a copper coil. The antenna 120 may be of any suitable shape, including (without being limited to) circular, rectangular and square shapes.

The card body 122 of the dual-interface IC card 100 is used to protect other components of the dual-interface IC card 100 and well as to give shape to the dual-interface IC card 100. The card body may be made of plastic or other suitable material. In some embodiments, an assembly step can be performed by attaching the antenna 120 and the card body 122 to the dual-interface IC module 150 to produce the dual-interface IC card 100.

Figure 14:
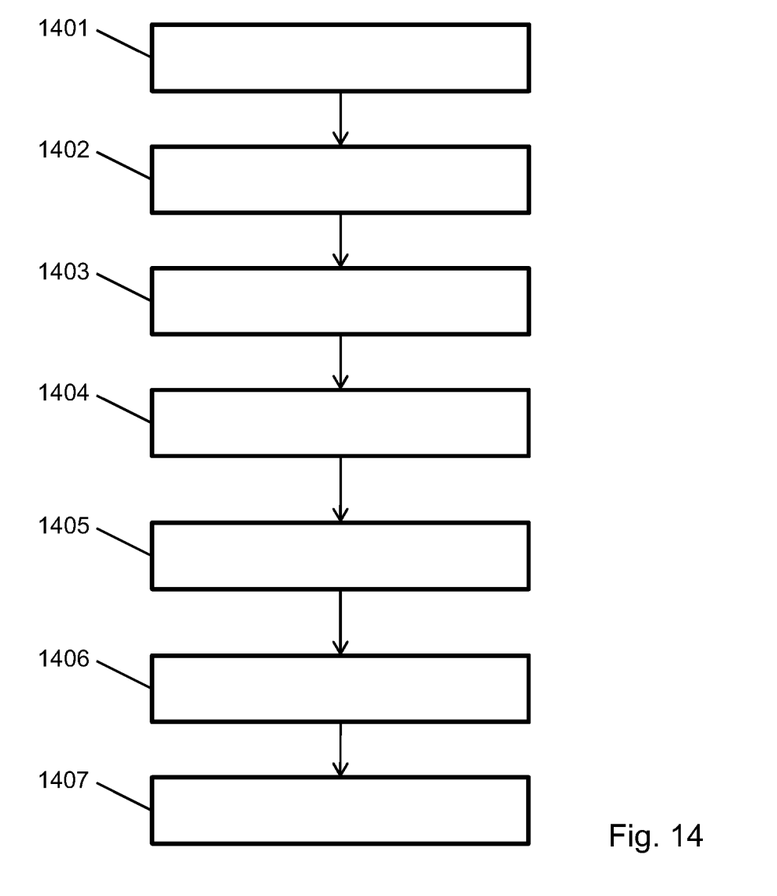
FIG. 14 is a flow diagram of an exemplary method of manufacturing a dual-interface integrated circuit card module.

FIG. 14 is a flow diagram illustrating an example embodiment of a manufacturing process for producing a dual-interface integrated circuit card module of the type disclosed herein. The method starts at step 1401 with providing a substrate having first and second opposing surfaces, with an adhesive layer on the first surface of the substrate. At step 1402 first and second recesses are formed together with the bonding holes into the substrate. At step 1403 contact plate is laminated to first surface of the substrate and subsequently structured and eventually plated. At step 1404 an antenna pad is placed into each of the first and second recesses.

At step 1405 an IC is placed on the second surface of the substrate. At step 1406 electrical connections, such as bond wires, are formed between the IC and the contact pad through the substrate, for example through holes provided in the substrate to allow connection to be made with the contact pad and connections are formed between each antenna pad and a corresponding antenna connection on the IC. In a final step 1407 IC and bond wires are covered with an encapsulated to mechanically protect the IC and the bond wires.

Figure 15:
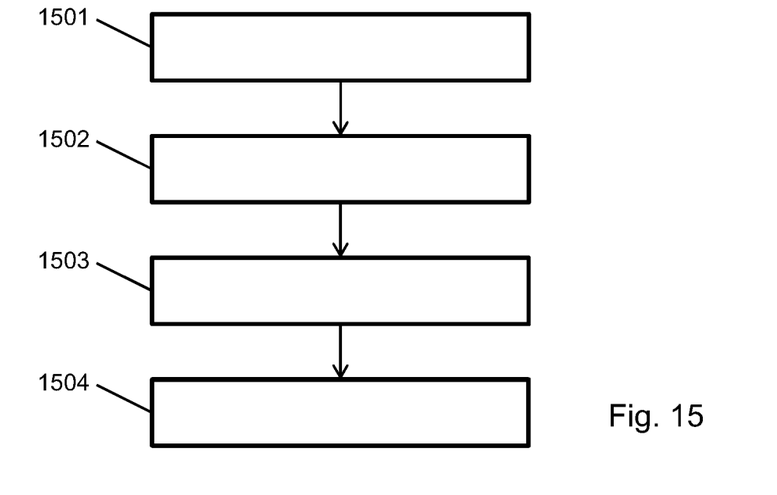
FIG. 15 is a flow diagram of an exemplary method of constructing a dual-interface integrated circuit card.

FIG. 15 is a flow diagram of an example method of constructing a dual-interface IC card. The method starts with step 1501 of providing a card body containing an antenna having a pair of antenna connections. At step 1502, a dual-interface IC card module is provided, the module being of the type described above, for example manufactured according to the process described with reference to FIG. 14. At step 1503 electrical connections are made between the antenna connections and the antenna pads of the module. At step 1504 the module is bonded to the card body. Steps 1503 and 1504 may be performed in reverse order, or may be performed simultaneously.

Although the operations of the method herein are shown and described in a particular order, the order of the operations of the method may be altered so that certain operations may be performed in a different order or so that certain operations may be performed, at least in part, concurrently with other operations. In another embodiment, instructions or sub-operations of distinct operations may be implemented in an intermittent and/or alternating manner.

From reading the present disclosure, other variations and modifications will be apparent to the skilled person. Such variations and modifications may involve equivalent and other features which are already known in the art of dual-interface cards, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A method of manufacturing a dual-interface integrated circuit card module, the method comprising:
   providing a substrate having first and second opposing surfaces, with a contact pad on the first surface of the substrate;
   forming first and second recesses in the second surface of the substrate;
   placing an antenna pad into each of the first and second recesses,
   wherein the first and second recesses pass through the substrate, the antenna pads being attached to a back surface of the contact pad with a non-conductive material, the non-conductive material in contact with the antenna pads and the contact pad, and the non-conductive material providing an insulating layer between the antenna pads and the contact pads;
   placing an integrated circuit on the second surface of the substrate;
   forming electrical connections between the integrated circuit and the contact pad through the substrate; and
   forming an electrical connection between each antenna pad and a corresponding antenna connection on the integrated circuit.

2. The method of claim 1, wherein forming an electrical connection between each antenna pad and a corresponding antenna connection on the integrated circuit comprises electrically connecting bond wires between each antenna pad and the corresponding antenna connection,
   wherein the method further comprises encapsulating the integrated circuit and bond wires in a protective material.

3. The method of claim 1, wherein placing an antenna pad into each of the first and second recesses comprises adhering the antenna pad to the back surface of the contact pad with an adhesive layer.

4. The method of claim 1, wherein the non-conductive material is a non-conductive adhesive.

5. A method of constructing a dual-interface integrated circuit card having aspects which correspond to claim 1, the method comprising:
   providing a card body containing an antenna, the antenna having a pair of antenna connections;

providing a dual-interface integrated circuit card module according to claim 1;

electrically connecting the antenna connections to the antenna pads of the module; and bonding the module to the card body.

6. The method of claim 1, wherein the non-conductive material comprises an adhesive layer that only covers a portion of overlapping area between the antenna s and the contact pads.

7. The method of claim 1, wherein placing an antenna pad into each of the first and second recesses further comprises placing an antenna pad into the first recess having a first part that is entirely contained within the first recess, and a second part that extends out of the first recess.

\* \* \* \* \*